United States Patent
Wann et al.

(10) Patent No.: US 8,242,540 B2
(45) Date of Patent: *Aug. 14, 2012

(54) EPITAXIAL GROWTH OF III-V COMPOUND SEMICONDUCTORS ON SILICON SURFACES

(75) Inventors: Clement Hsingjen Wann, Carmel, NY (US); Chih-Hsin Ko, Fongshan (TW); Cheng-Hsien Wu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 159 days.

This patent is subject to a terminal disclaimer.

(21) Appl. No.: 12/813,822

(22) Filed: Jun. 11, 2010

(65) Prior Publication Data

US 2011/0304021 A1     Dec. 15, 2011

(51) Int. Cl.
*H01L 21/02*     (2006.01)
(52) U.S. Cl. .................. 257/200; 257/E31.059; 257/14; 257/79; 257/189; 257/615; 438/22; 438/285; 438/478; 438/481; 438/604

(58) Field of Classification Search ........... 257/E31.059, 257/14, 79, 189, 200, 615; 438/22, 285, 438/478, 481, 604
See application file for complete search history.

(56) References Cited

U.S. PATENT DOCUMENTS 6,635,901 B2 * 10/2003 Sawaki et al. .................... 257/80
7,956,370 B2 *  6/2011 Pan ................................. 257/95

OTHER PUBLICATIONS

"Surface reconstruction," www.wikipedia.com, downloaded Sep. 13, 2010, 6 pgs.

* cited by examiner

*Primary Examiner* — Asok Sarkar
(74) *Attorney, Agent, or Firm* — Slater & Matsil, L.L.P.

(57) ABSTRACT

A device includes a silicon substrate, and a III-V compound semiconductor region over and contacting the silicon substrate. The III-V compound semiconductor region has a U shaped interface with the silicon substrate, with radii of the U shaped interface being smaller than about 1,000 nm.

20 Claims, 6 Drawing Sheets

EPITAXIAL GROWTH OF III-V COMPOUND SEMICONDUCTORS ON SILICON SURFACES

TECHNICAL FIELD

This disclosure relates generally to integrated circuit devices, and more particularly to the formation of III-V compound semiconductors on silicon substrates.

BACKGROUND

The speed of metal-oxide-semiconductor (MOS) transistors is closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (referred to as III-V compound semiconductors hereinafter) are good candidates for forming transistors due to their high electron mobility. Therefore, III-V based transistors have been explored. However, III-V compound semiconductor films need to be grown on other substrates because it is difficult to obtain bulk III-V crystals. The growth of III-V compound semiconductor films on dissimilar substrates faces difficulties because these substrates have lattice constants and thermal expansion coefficients different than that of the III-V compound semiconductors. Various methods have been used to form high quality III-V compound semiconductors. For example, III-V compound semiconductors were grown from trenches between shallow trench isolation regions to reduce the number of threading dislocations.

III-V compound semiconductors may be formed on silicon substrates with a <111> surface orientation, which silicon substrates are known as Si(111) substrates. It was found that immediately after being cleaved or etched, Si(111) substrates may have 1×1 or 2×1 reconstructions (with the respective surfaces denoted as Si(111):1×1 surfaces or Si(111):2×1 surfaces hereinafter). However, after being annealed at about 400° C., the Si(111) surface may be reconstructed to form a stable Si(111):7×7 surface (which is a Si(111) surface with a 7×7 reconstruction). The Si(111):7×7 surfaces are not suitable for growing high-quality III-V compound semiconductors. Previous research has revealed that through annealing at temperatures higher than 900° C., the Si(111):7×7 surfaces may be converted back to Si(111):1×1 surfaces. However, III-V compound semiconductors needs to be grown at temperatures lower than 900° C. When the temperatures of Si(111) substrates are lowered to the temperatures for growth, the Si(111): 1×1 surfaces are again converted back to Si(111): 7×7 surfaces, and the resulting III-V compound semiconductors may have many stacking faults.

SUMMARY OF THE INVENTION

In accordance with one aspect, a device includes a silicon substrate, and a III-V compound semiconductor region over and contacting the silicon substrate. The III-V compound semiconductor region has a U shaped interface with the silicon substrate, with the radii of the U shaped interface being smaller than about 1,000 nm.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming III-V compound semiconductors comprising group III and group V elements is provided in accordance with an embodiment. The intermediate stages of manufacturing embodiments are illustrated. Throughout the various views and illustrative embodiments, like reference numbers are used to designate like elements.

Figure 1:
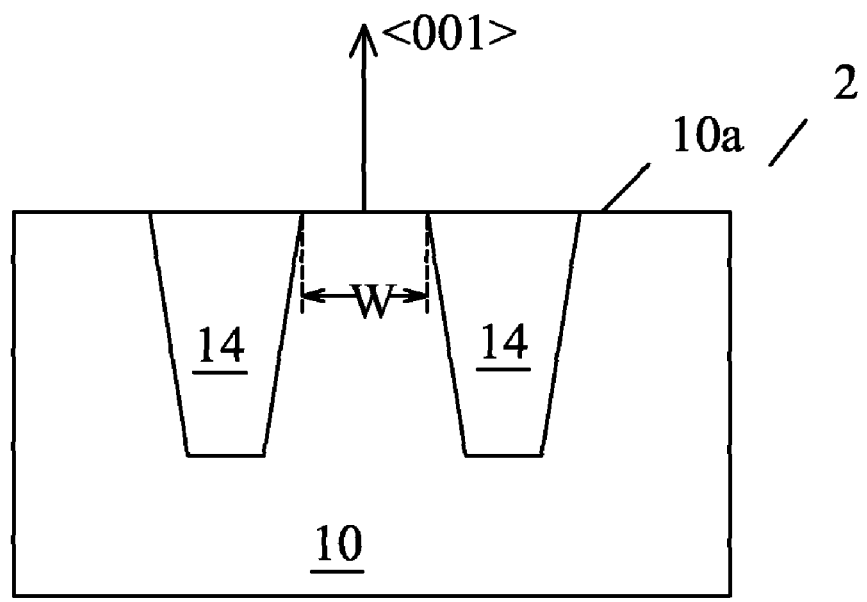
FIGS. 1 through 4 are cross-sectional views and a top view of intermediate stages in the epitaxial growth of a III-V compound semiconductor region on a Si(001) substrate.

FIGS. 1 through 4 illustrate the cross-sectional views and a top view of intermediate stages in the epitaxial growth of a III-V compound semiconductor region in accordance with an embodiment. Referring to FIG. 1, substrate 10, which is a part of semiconductor wafer 2, is provided. In an embodiment, substrate 10 is a Si(001) substrate with major surface 10a having <001> surface orientation, and the respective surface is referred to as a Si(001) surface hereinafter. Insulation regions such as shallow trench isolation (STI) regions 14 are formed in substrate 10. The formation of STI regions 14 includes forming openings (now filled with STI regions 14) in substrate 10, and filling the openings with a dielectric material(s). Distance W between opposite sidewalls of STI regions 14 may be less than about 1,000 nm, for example, although different widths W may be used.

Figure 2A:
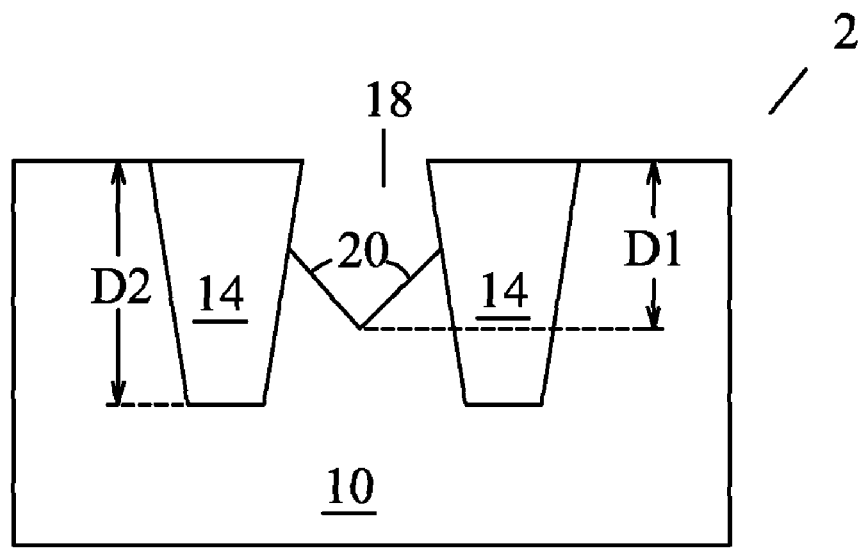

Next, as shown in FIG. 2A, the portion of substrate 10 between opposite sidewalls of STI regions 14 is etched to form trench 18. Recessing depth D1 may be less than thickness D2 of insulation regions 14. Furthermore, recessing depth D1 may be between about 50 nm and about 500 nm, for example. In an embodiment, the etching of substrate 10 is performed using a wet etch, with a KOH solution, for example, used as an etchant. Accordingly, slanted surfaces 20 are formed. Slanted surfaces 20 may be substantially straight.

Figure 2B:
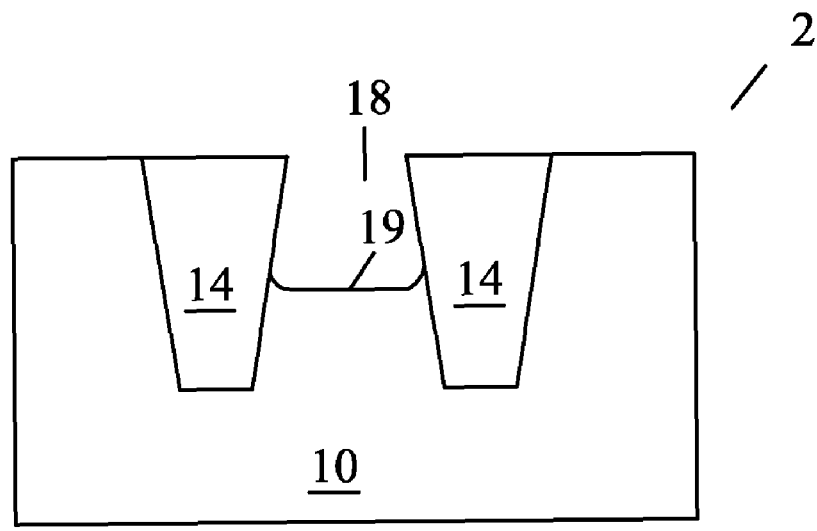
Figure 2C:
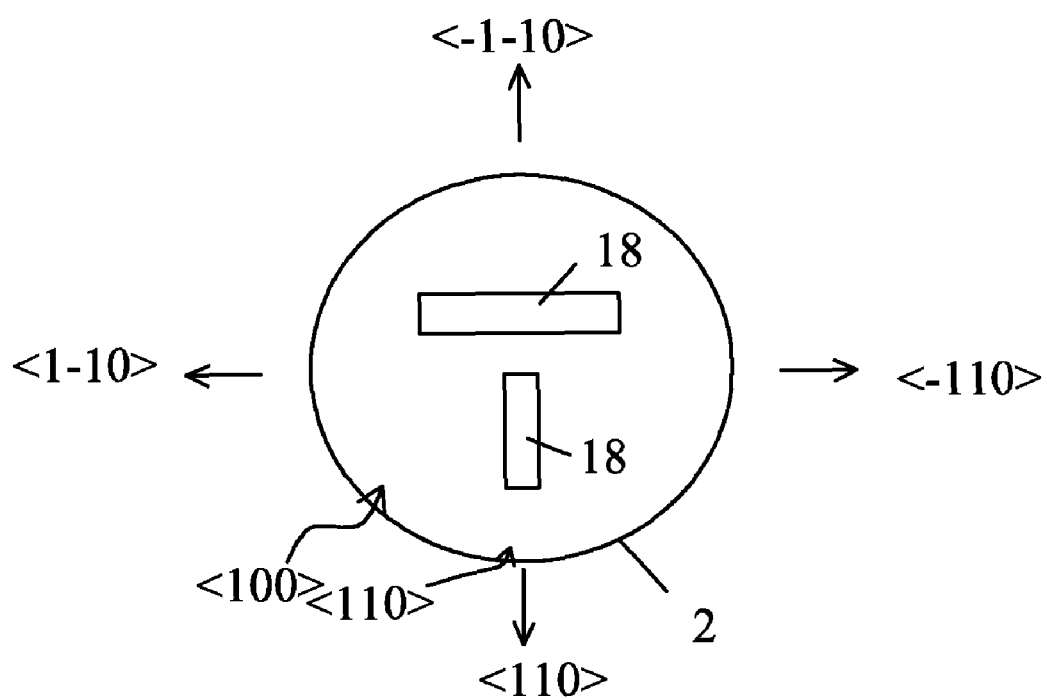

FIG. 2C illustrates a top view of wafer 2, wherein crystal directions <1-10>, <-110>, <-1-10>, and <110> of silicon substrate 10 are marked. The <110> and <100> notches are also marked. In an embodiment, the longitudinal direction of trench 18 is parallel to <1-10> and <-110> directions. Alternatively, the longitudinal direction of trench 18 is parallel to <-1-10> and <110> directions.

Figure 3A:
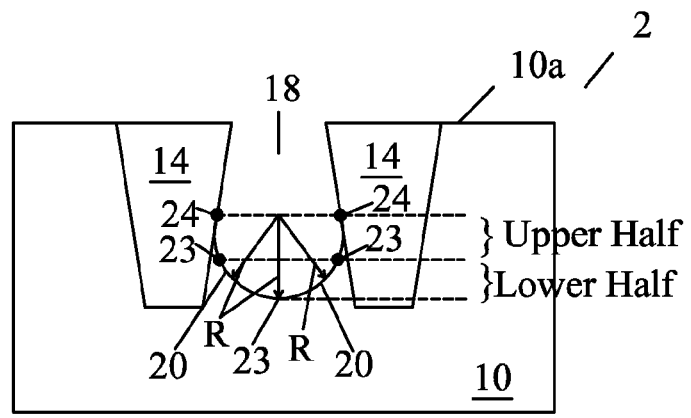

Next, as shown in FIG. 3A, an annealing is performed to anneal wafer 2 and substrate 10, so that trench 18 has a U shaped bottom. Surfaces 20 thus become curved, rather than substantially straight as shown in FIG. 2A. In an embodiment, radii R of the curves of the U shaped bottom are smaller than about 1,000 nm. For example, at bottom 23, which is at, or close to, the middle point between opposite sidewalls of STI regions 14, the radius of surface 20 has a radius R smaller than about 1,000 nm, less than about 500 nm, or even less than about 200 nm or 100 nm. Further, top edges 24 of the U shaped bottom are also joint between the U shaped bottom and STI regions 14, and at the middle points bottom 23 and top edges 24, radii R may also be less than about 1,000 nm, less than about 500 nm, or even less than about 200 nm or 100 nm. The U shaped bottom may be divided into an upper half and a lower half with equal heights. In an embodiment, an entirety of the lower half of the U shaped bottom may have a substantially uniform radius R. For example, the difference between radii R of different parts of the lower half of the U shaped bottom is less than about 10 percent, for example.

The annealing may be a hydrogen annealing, and may be performed by annealing substrate 10 in a hydrogen containing environment, for a duration, for example, between about 0.1 minutes and about 10 minutes, until the U shaped bottom has a desirable profile. The process gas may include hydrogen ($H_2$) and other process gases. After the hydrogen annealing, the U shaped surface 20 of substrate 10 may comprise many small surface portions, which have great off angles α, as shown in FIG. 3B.

Figure 3B:
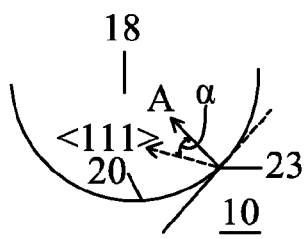

FIG. 3B illustrates an amplified portion of surface 20 in trench 18. Surface orientation A of surface 20 at points 23 may be close to <111> direction (surface orientation), but deviates from <111> direction by off angle α. It is observed that the illustrated <111> direction is merely illustrative, and may be drawn differently. In an embodiment, at middle points 23, and may be throughout surface 20, off angle α is greater than 6 degrees, and may be greater than about 12 degrees or greater than about 20 degrees. Off angle α may also be between about 6 degrees and about 20 degrees.

In alternative embodiments, the U shaped bottom of trench 18 is formed by performing an anisotropic etch such as a dry etch, followed by an isotropic etch such as a wet etch. Referring to FIG. 2B, a dry etch is performed to form trench 18, which has a substantially flat bottom 19, although the corners of the bottoms may be slightly curved. The dry etch may be performed with plasma turned on. Next, an isotropic etch, such as a wet etching, may be performed to round the bottom of trench 18. Appropriate etchants are needed to form the U shaped bottom. The resulting structure may also be shown in FIGS. 3A and 3B. During the wet etching, the bottom of trench 18 may also be smoothened.

It is observed that the Si(111) surfaces may have 1×1 reconstructions (with the respective surfaces referred to as Si(111):1×1 surfaces hereinafter), for example, immediately after substrate 10 is cleaved or etched. The Si(111) surfaces may be undesirably converted to surfaces having stable 7×7 reconstructions, which surfaces are referred to as Si(111):7×7 surfaces hereinafter. Since Si(111):7×7 surfaces are not suitable for growing III-V compound semiconductors, an annealing is performed on wafer 2 to convert the Si(111):7×7 surfaces back to Si(111): 1×1 surfaces. The annealing temperature may be greater than about 900° C. In an exemplary embodiment, the annealing temperature is about 1000° C. During the annealing, process gases such as $N_2$ and $AsH_3$ may be introduced into the annealing chamber. The duration of the annealing may be between about 1 minute and about 30 minutes. After the annealing, the likely Si(111):7×7 surfaces at the bottom of trench 18 are converted to Si(111):1×1 surfaces.

Figure 4:
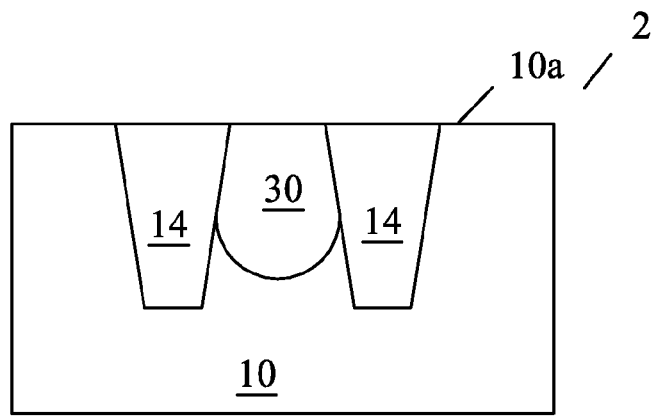

After the annealing, the temperature of substrate 10 is lowered to a temperature suitable for epitaxially growing a III-V compound semiconductor region, and an epitaxial growth is performed to grow III-V compound semiconductor region 30 in trench 18. The resulting structure is shown in FIG. 4. In an exemplary embodiment, the growth temperature is about 350° C., although different growth temperatures may be used. Since the surfaces of silicon substrate 10 in trench 18 have large off angles, during the procedure of lowering temperatures, the Si(111):1×1 surfaces at the bottom of trench 18 are preserved, and are not converted to Si(111):7×7 surfaces.

Referring again to FIG. 4, compound semiconductor region 30 may be formed of a III-V compound semiconductor material comprising, but is not limited to, GaAs, InP, GaN, InGaAs, InAlAs, GaSb, AlSb, AlAs, AlP, GaP, combinations thereof, and multi-layers thereof. The top surface of III-V compound semiconductor region 30 may be level with, higher than, or lower than, top surface 10a of substrate 10. Since Si(111): 1×1 surfaces are preserved when the epitaxial growth is started, the quality of the resulting III-V compound semiconductor region 30 is improved.

Figure 5:
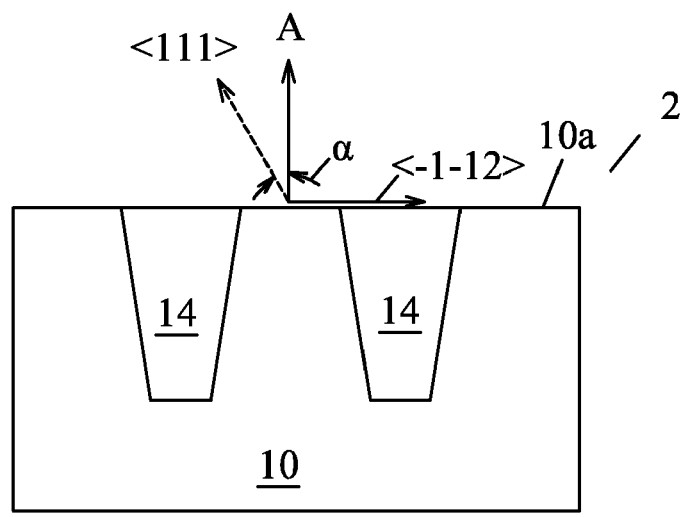
FIGS. 5 through 7B are cross-sectional views and a top view of intermediate stages in the manufacturing of a III-V compound semiconductor region on a Si(111) substrate.

FIGS. 5 through 7B illustrate alternative embodiments. Unless specified otherwise, the reference numerals in these embodiments represent like elements in the embodiments illustrated in FIGS. 1 through 4. In these embodiments, substrate 10 is a Si(111) substrate with major surface 10a. As shown in FIG. 5, surface orientation A of major surface 10a may be close to <111> direction (surface orientation), with off angle α. Off angle α may be greater than about 6 degrees, greater than about 12 degrees, greater than about 15 degrees, and may even be greater than about 20 degrees. Further, off angle α may be between about 12 degrees and about 30 degrees. In an embodiment, off angle α deviates from <111> and tilts toward <-1-12> direction, as schematically illustrated in FIG. 5. STI regions 14 are formed in substrate 10.

Figure 6A:
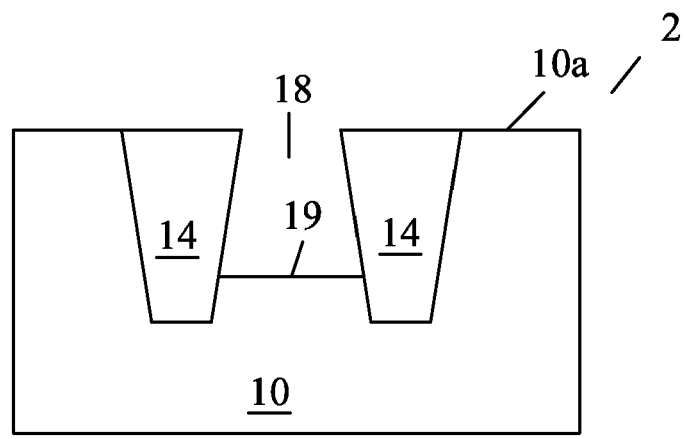

Referring to FIG. 6A, trench 18 is formed by etching the portion of substrate 10 between opposite sidewalls of STI regions 14. In an embodiment, an etchant that attacks silicon in <111> direction more than other directions is used, so that a substantially flat bottom 19 is formed. Accordingly, bottom surface 19 has essentially the same surface orientation as major surface 10a. In an exemplary embodiment, the etchant is an HCl solution.

Figure 6B:
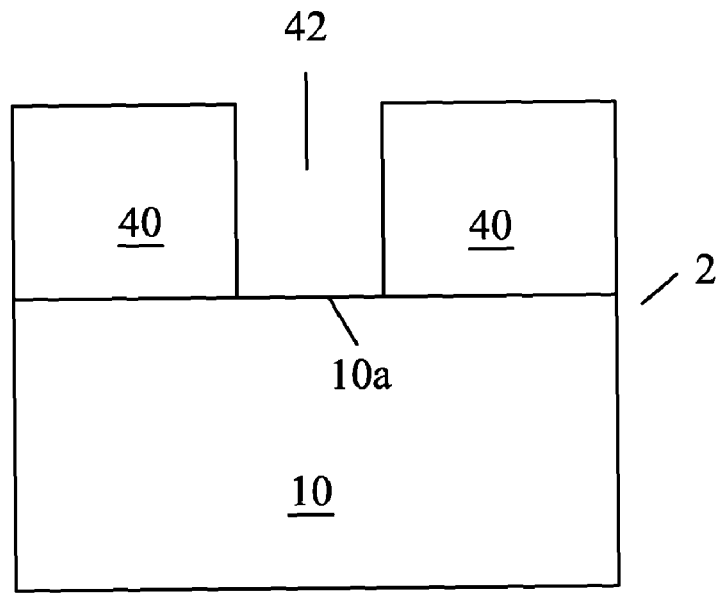

In alternative embodiments, as shown in FIG. 6B, instead of forming STI regions 14 in substrate 10 and then recessing substrate 10, dielectric layer 40 is formed on surface 10a of substrate 10, for example, using a deposition method. A portion of surface 10a is exposed through trench 42 in dielectric layer 40. Dielectric layer 40 may be formed of silicon oxide, silicon nitride, or the like. Using this method, the exposed portion of surface 10a also has the original surface orientation.

Figure 6C:
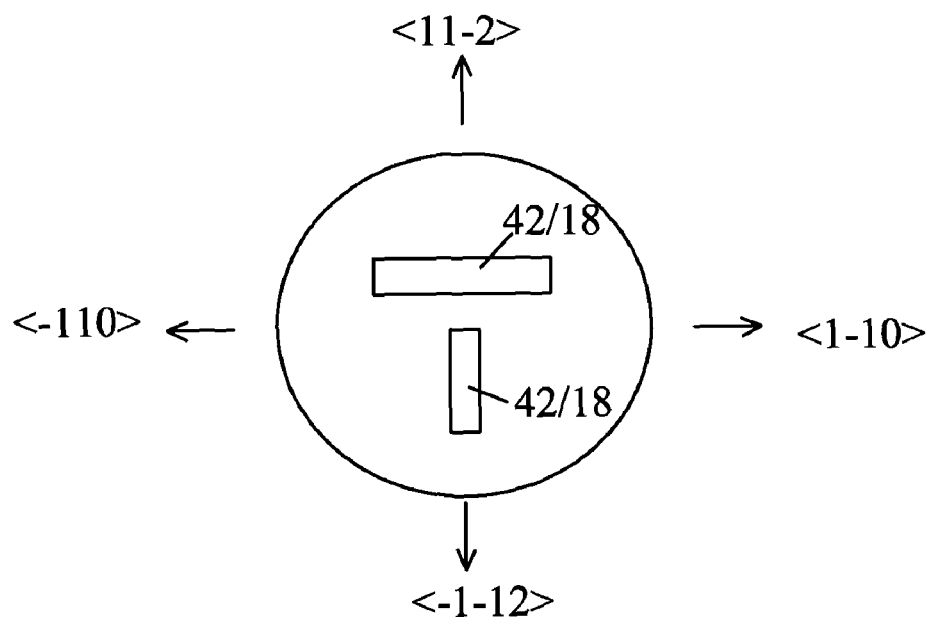

FIG. 6C illustrates a top view of the structure shown in FIGS. 6A and 6B, wherein crystal directions of silicon substrate 10 are marked. In an embodiment, the longitudinal direction of trench 42/18 is parallel to <-110> and <1-10> directions. Alternatively, the longitudinal direction of trench 42 is parallel to <11-2> and <-1-12> directions.

Figure 7A:
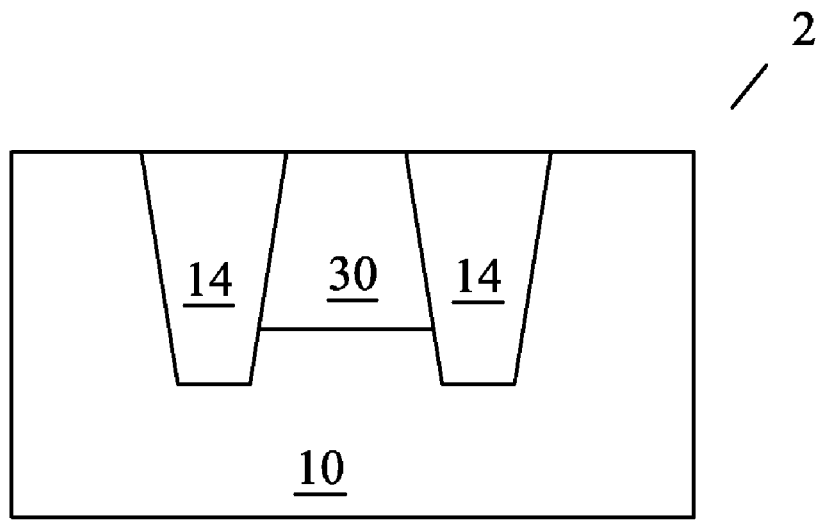
Figure 7B:
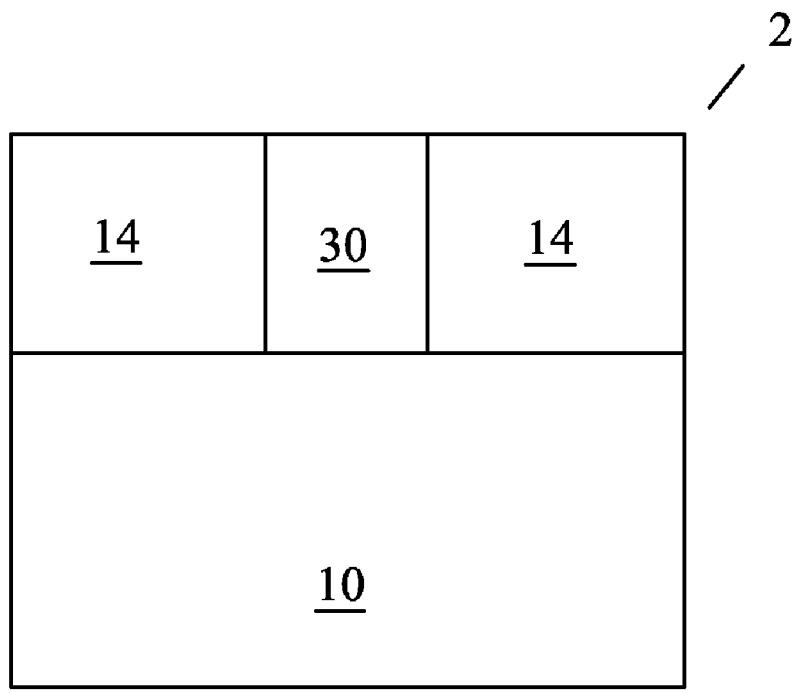

After the structure as shown in FIGS. 6A through 6C is formed, an annealing is performed to convert the possible Si(111):7×7 surfaces of substrate 10 into Si(111):1×1 surfaces. Process is then continued to epitaxially grow III-V compound semiconductor region 30. The exemplary resulting structures are shown in FIGS. 7A and 7B, with FIG. 7A corresponding to FIG. 6A, and FIG. 7B corresponding to FIG. 6B. The annealing and the formation of III-V compound semiconductor region 30 are essentially the same as in the embodiments shown in FIGS. 1 through 4, and hence are not repeated herein. Again, since substrate 10 has a Si(111) surface with a large off angle, when the temperature is lowered from over 900° C. to the growth temperature for the epitaxial growth, Si(111): 1×1 surfaces may be preserved, and will not be converted back to Si(111):7×7 surfaces again. The quality of III-V compound semiconductor region 30 is thus improved.

In the embodiments, by performing an annealing on a silicon substrate before a III-V compound semiconductor region is epitaxially grown thereon, the undesirable Si(111): 7×7 surfaces are converted to desirable Si(111):1×1 surfaces that are better suited for growing III-V compound semiconductors. Further, by forming large off angles, the Si(111): 1×1 surfaces resulted from the annealing may be preserved until the III-V compound semiconductor region is grown.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a silicon substrate; and
   a III-V compound semiconductor region over and contacting the silicon substrate, wherein the III-V compound semiconductor region has a U shaped interface with the silicon substrate, wherein a lower half of the U shaped interface has a substantially uniform radius, with the radius being smaller than about 1,000 nm.

2. The device of claim 1, wherein substantially an entirety of the lower half of the U shaped interface has the substantially uniform radius.

3. The device of claim 1, wherein the silicon substrate is a Si(001) substrate, with a major surface being a Si(001) surface.

4. The device of claim 1, wherein the III-V compound semiconductor region has a longitudinal direction parallel to <1-10> and <−110> directions of the silicon substrate.

5. The device of claim 1, wherein the III-V compound semiconductor region has a longitudinal direction parallel to <−1-10> and <110> directions of the silicon substrate.

6. The device of claim 1 further comprising insulation regions in the silicon substrate, wherein the III-V compound semiconductor region is between opposite sidewalls of the insulation regions.

7. The device of claim 6, wherein a surface of the silicon substrate contacting the III-V compound semiconductor region has an off angle greater than about 6 degrees.

8. The device of claim 7, wherein the off angle is greater than about 12 degrees.

9. A device comprising:
   a silicon substrate, wherein a major surface of the silicon substrate is a (111) surface having an off angle greater than about 6 degrees;
   insulation regions over a portion of the silicon substrate; and
   a III-V compound semiconductor region between opposite sidewalls of the insulation regions, with a bottom of the III-V compound semiconductor region contacting the silicon substrate.

10. The device of claim 9, wherein the off angle is between about 12 degrees and about 30 degrees.

11. The device of claim 9, wherein the off angle tilts toward a <−1-12> direction of the silicon substrate.

12. The device of claim 9, wherein the III-V compound semiconductor region and the silicon substrate form a substantially flat interface.

13. The device of claim 9, wherein the III-V compound semiconductor region has a longitudinal direction parallel to <−110> and <1-10> directions of the silicon substrate.

14. The device of claim 9, wherein the III-V compound semiconductor region has a longitudinal direction parallel to <11-2> and <−1-12> directions of the silicon substrate.

15. A method of forming a device, the method comprising:
   providing a silicon substrate, wherein a major surface of the silicon substrate is a Si(001) surface;
   forming insulation regions extending from the major surface into the silicon substrate, with a portion of the silicon substrate being between opposite sidewalls of the insulation regions;
   etching the portion of the silicon substrate to form a trench having a U-shaped bottom, wherein at least a lower half of the U-shaped bottom has a substantially uniform radius;
   annealing the silicon substrate at a first temperature higher than about 900° C.;
   lowering a temperature of the silicon substrate from the first temperature to a second temperature; and
   epitaxially growing a III-V compound semiconductor region in the trench at the second temperature.

16. The method of claim 15, wherein the step of etching the portion of the silicon substrate comprises:
   etching the portion of the silicon substrate to form a trench having a V shaped bottom; and
   performing a hydrogen annealing to form the trench having the U-shaped bottom.

17. The method of claim 15, wherein the step of etching the portion of the silicon substrate comprises:
   performing an anisotropic etching to etch the portion of the silicon substrate to form the trench having a substantially flat bottom; and
   performing an isotropic etching to further etch the substantially flat bottom to form the trench having the U-shaped bottom.

18. The method of claim 15, wherein a top surface of the silicon substrate exposed to the trench is a <111> surface with an off angle greater than about 6 degrees.

19. The method of claim 18, wherein the off angle is between about 12 degrees and about 30 degrees.

20. The method of claim 15, wherein after the step of annealing the silicon substrate, the silicon substrate has a Si(111): 1×1 surface in the trench.

* * * * *